United States Patent
Seo et al.

(10) Patent No.: US 7,587,013 B2
(45) Date of Patent: Sep. 8, 2009

(54) APPARATUS FOR UPDATING GAIN OF LOOP FILTER

(75) Inventors: Il-Won Seo, Yongin-Si (KR); Jong-Shin Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 584 days.

(21) Appl. No.: 11/496,692

(22) Filed: Jul. 31, 2006

(65) Prior Publication Data

US 2007/0036253 A1 Feb. 15, 2007

(30) Foreign Application Priority Data

Aug. 9, 2005 (KR) .................. 10-2005-0073000

(51) Int. Cl.
*H04L 7/00* (2006.01)
(52) U.S. Cl. .................. 375/354; 375/345; 704/225
(58) Field of Classification Search .................. 375/345, 375/354; 704/225
See application file for complete search history.

(56) References Cited

U.S. PATENT DOCUMENTS

| | | | |
|---|---|---|---|
| 6,766,153 B2 | 7/2004 | Kozak et al. | ............. 455/232.1 |
| 2003/0232606 A1* | 12/2003 | Akahori | ...................... 455/123 |
| 2004/0071207 A1 | 4/2004 | Skidmore et al. | |
| 2005/0069055 A1* | 3/2005 | Song et al. | .................. 375/324 |

FOREIGN PATENT DOCUMENTS

JP          10-013585          9/1998

* cited by examiner

*Primary Examiner*—Curtis B Odom
(74) *Attorney, Agent, or Firm*—Monica H. Choi

(57) ABSTRACT

For updating a gain of a loop filter from a timing error signal, a timing signal estimator generates a current timing signal estimation value from a prior timing error estimation value, a prior gain value, and a prior timing signal estimation value. A timing error estimator generates a current timing error estimation value from a timing error accumulation value and the current timing signal estimation value. A current gain value of the loop filter is determined from the current timing error estimation value.

20 Claims, 4 Drawing Sheets

APPARATUS FOR UPDATING GAIN OF LOOP FILTER

This application claims priority to Korean Patent Application No. 2005-73000, filed on Aug. 9, 2005 in the Korean Intellectual Property Office, the disclosure of which is incorporated herein in its entirety by reference.

BACKGROUND OF THE INVENTION

1. Field of the Invention

The present invention relates generally to loop filters, and more particularly, to an apparatus for updating a gain of a loop filter with simple low-cost hard-ware components and without monitoring external noise.

2. Description of the Related Art

A timing recovery apparatus detects a timing error to recover a timing signal. FIG. 1 is a block diagram of a conventional timing recovery apparatus 100. Referring to FIG. 1, the timing recovery apparatus 100 includes a timing error detector 120, a loop filter 200, a numerically controlled oscillator (NCO) 140, and a timing error compensator 110.

The timing error detector 120 detects a timing error from a timing signal TS to generate a detected timing error signal TE. The loop filter 200 integrates the timing error signal TE to generate a loop filter output signal LF_out. The loop filter output signal LF_out is sent to the timing error compensator 110 via the NCO 140. The timing error compensator 110 compensates for the timing error TE to recover the timing signal TS. Such components 110, 120 140, and 200 of the timing recovery apparatus 100 are known to one of ordinary skill in the art.

Generally, the loop filter 200 is a kind of low pass filter that integrates the timing error signal TE to generate the loop filter output signal LF_out so as to determine the bandwidth of a feed-back loop formed by the components 110, 120 140, and 200. Thus, the loop filter 200 determines the sensitivity to noise and the stability of such a feed-back loop.

FIG. 2 is a block diagram of the loop filter 200 of FIG. 1. Referring to FIG. 2, the loop filter 200 is implemented as a PI (proportional-integral) controller and includes a phase error tracking unit 210, a frequency error tracking unit 220, and a summer 230. The phase error tracking unit 210 multiplies the timing error signal TE by a proportional gain KP to track a phase component of the timing error signal TE.

The frequency error tracking unit 220 accumulates prior values of the timing error signal TE multiplied by an integral gain KI, to track a frequency component of the timing error signal TE. The summer 230 adds the output signals of the phase error tracking unit 210 and the frequency error tracking unit 220 to generate the loop filter output signal LF_out that tracks both the phase component and the frequency component of the timing error signal TE.

The loop filter output signal LF_out is generated to be relatively large by setting the proportional and integral gains KP and KI to be relatively large initially such that the timing error compensator 110 rapidly converges to the timing signal TS. After a predetermined period of time, the timing signal TS has converged to a certain extent, and the proportional and integral gains KP and KI are decreased as the timing signal TS is recovered.

The proportional and integral gains KP and KI in the conventional loop filter 200 are estimated through modeling and simulation. However, such estimated gain values KP and KI may not reflect actual operating conditions of the loop filter 200 for factors not estimated in the modeling process. In that case, the timing signal TS cannot be properly recovered.

To solve such a problem, a Kalman algorithm is generally used to estimate the gain values of a loop filter. Generally, such a loop filter is referred to as a Kalman filter. The Kalman filter monitors noise caused by modeling or noise caused by a detector to estimate the gain. That is, the Kalman filter calculates an error covariance including external noise and calculates the gain of the Kalman filter from the error covariance. Thus, a variation in the external noise must be correctly monitored in order to obtain the correct gain of the Kalman filter. Such close monitoring of the external noise may be difficult to implement.

Furthermore, a Kalman algorithm includes many complicated calculating expressions. Accordingly, a Kalman filter performing complicated calculations, especially for dividing operations, has costly hardware. For example, U.S. Patent Application No. US 2004/0071207 uses interpolation residual calculation which includes dividing operations for an adaptive Kalman filter. Alternatively, U.S. Pat. No. 6,766,153 to Kozak et al. uses a Kalman gain coefficient table for implementing a Kalman filter. However, such a table may require a costly memory for storing values of the table.

SUMMARY OF THE INVENTION

Accordingly, a gain of a loop filter is updated in embodiments of the present invention with simple hard-ware and without monitoring external noise.

For updating a gain of a loop filter from a timing error signal according to an aspect of the present invention, a timing signal estimator generates a current timing signal estimation value from a prior timing error estimation value, a prior gain value, and a prior timing signal estimation value. In addition, a timing error estimator generates a current timing error estimation value from a timing error accumulation value and the current timing signal estimation value. A current gain value of the loop filter is determined from the current timing error estimation value.

In another embodiment of the present invention, an error covariance calculator generates an error covariance value from the current timing error estimation value. Furthermore, a gain calculator determines the current gain value from the error covariance value.

In one example embodiment of the present invention, the error covariance calculator generates the error covariance value from a minimum of a square of the current timing error estimation value and an absolute value of the current timing error estimation value. In another embodiment of the present invention, the gain calculator generates the current gain value as the error covariance value.

In an example embodiment of the present invention, the timing signal estimator includes a multiplier and a summer. The multiplier multiplies the prior timing error estimation value by the prior gain value to generate a multiplier output. The summer adds the multiplier output and the prior timing signal estimation value to generate the current timing signal estimation value.

In another embodiment of the present invention, the timing error estimator includes a timing error accumulator and a subtractor. The timing error accumulator accumulates prior values of the timing error signal to generate the timing error accumulation value. The subtractor subtracts the current timing signal estimation value from the timing error accumulation value to generate the current timing error estimation value.

The present invention may be used to particular advantage when the current gain value is for one of a proportional gain and an integral gain in the loop filter. In that case, the loop filter is coupled in a feed-back loop for generating a loop filter output from the current gain value and the timing error signal such that the loop filter output determines adjustment of a timing signal in the feed-back loop of a timing signal recovery apparatus.

In this manner, the gain of the loop filter is adjusted "on-the-fly" from prior values of the gain, the estimated timing signal, and the estimated timing error signal. In addition, a multiplier, a summer, and a subtractor are used for adjusting a gain within the loop filter without a divider for low cost hard-ware implementation of the loop filter.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, and 6 refer to elements having similar structure and/or function.

DETAILED DESCRIPTION OF THE INVENTION

Figure 3:
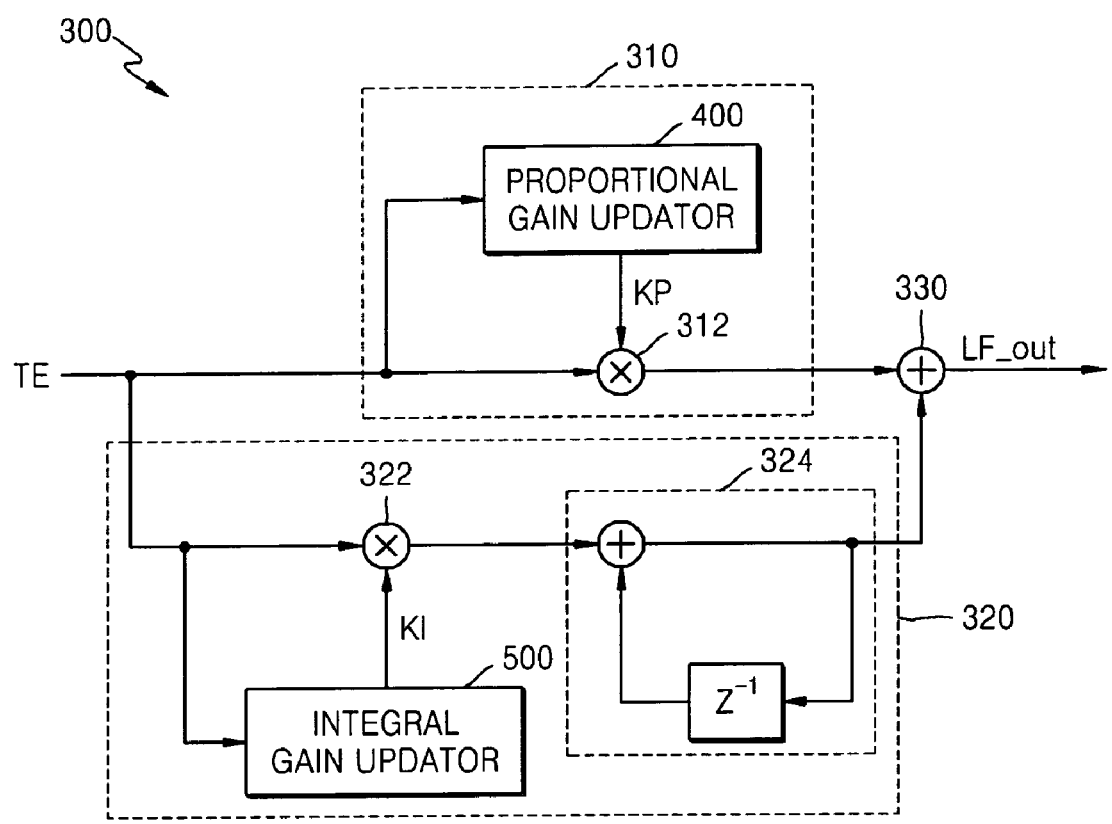
FIG. 3 is a block diagram of a loop filter including an apparatus for updating gain according to an embodiment of the present invention.
Figure 5:
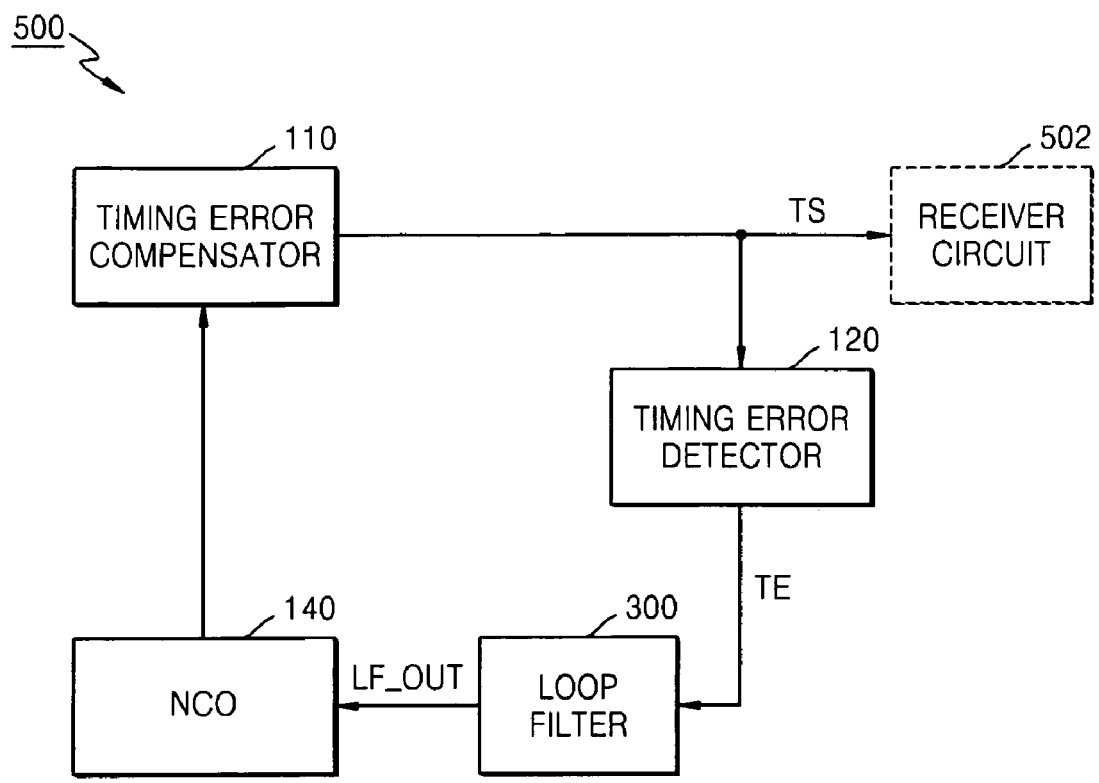
FIG. 5 is a block diagram of a timing recovery apparatus using the loop filter of FIG. 3, according to an embodiment of the present invention.

FIG. 3 is a block diagram of a loop filter 300 including gain updators, each implemented according to an embodiment of the present invention. FIG. 5 is a block diagram of a timing recovery apparatus 500 having the loop filter 300 in a feed-back path. The feed-back path is comprised of the timing error compensator 110, the timing error detector 120, and the numerically controlled oscillator 140 that operate as already described above in reference to FIG. 1. The feed-back path of FIG. 5 also includes the loop filter 300 of FIG. 3.

Figure 1:
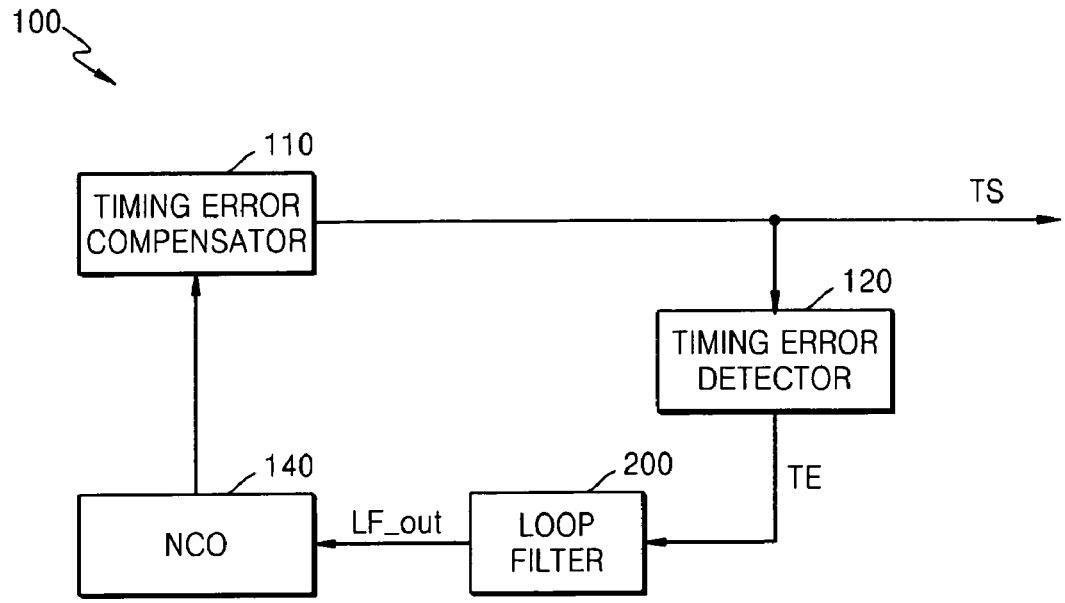
FIG. 1 is a block diagram of a conventional timing recovery apparatus.

The timing recovery apparatus 500 of FIG. 5 operates similarly as described for the timing recovery apparatus 100 of FIG. 1 for recovering the timing signal TS from the detected error signal TE. The timing signal TS is used by a circuit such as a receiver circuit 502 in FIG. 5 for example for determining a timing of operations of the receiver circuit 502. For example, the timing signal TS is used as a clock signal by the receiver circuit 502.

Figure 2:
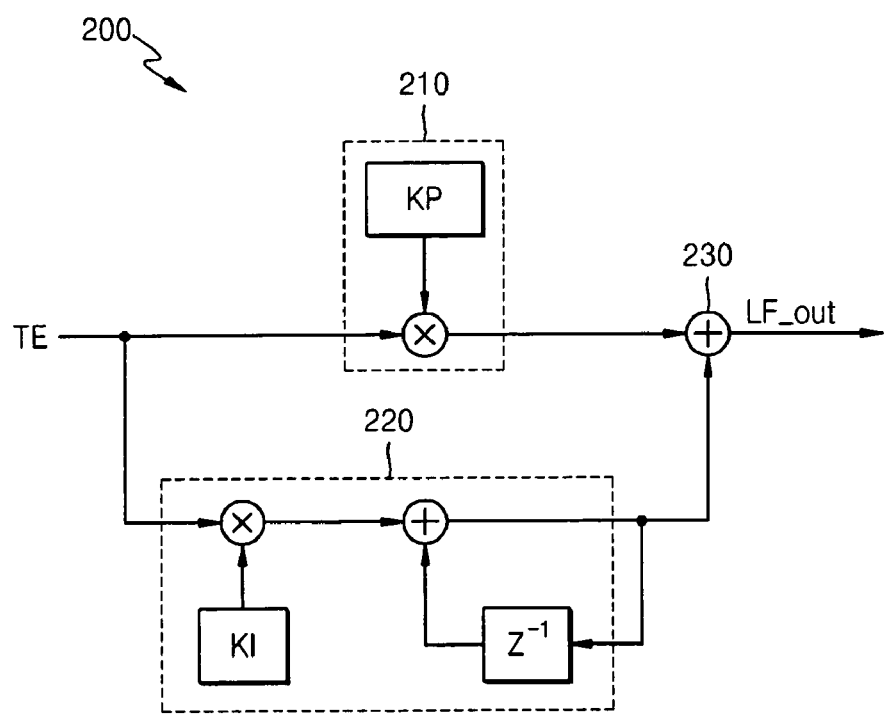
FIG. 2 is a block diagram of the loop filter of FIG. 1, according to the prior art.

Referring to FIG. 3, the loop filter 300 is different from the loop filter of FIG. 2 because the loop filter 300 has gain updators 400 and 500 that each generates a respective gain that is updated continuously, according to an embodiment of the present invention. A proportional gain updator 400 generates a proportional gain KP, and an integral gain updator 500 generates an integral gain KI. Each of the gain updators 400 and 500 continuously updates the gains KP and KI, respectively, from the timing error signal TE generated by the timing error detector 120 in the timing recovery apparatus 500 of FIG. 5.

The loop filter 300 includes a phase error tracking unit 310, a frequency error tracking unit 320, and a summer 330. The phase error tracking unit 310 includes the proportional gain updator 400 and a first multiplier 312 that multiplies the timing error signal TE by the updated proportional gain KP to generate a phase error tracking output. In this manner, the phase error tracking unit 310 tracks a phase component of the timing error signal TE.

The frequency error tracking unit 320 includes the integral gain updator 500 and a second multiplier 322 that multiplies the timing error signal TE by the updated integral gain KI. In addition, frequency error tracking unit 320 includes a frequency accumulator 324 having a delay unit and a summer for accumulating prior values of the timing error signal TE multiplied by the updated integral gain KI to generate a frequency error tracking output. In this manner, the frequency error tracking unit 320 tracks a frequency component of the timing error signal TE.

The summer 330 adds the phase error tracking output from the phase error tracking unit 310 and the frequency error tracking output from the frequency error tracking unit 320 to generate a loop filter output signal LF_out. The loop filter output signal LF_out tracks both the phase component and frequency component of the timing error signal TE.

Figure 4:
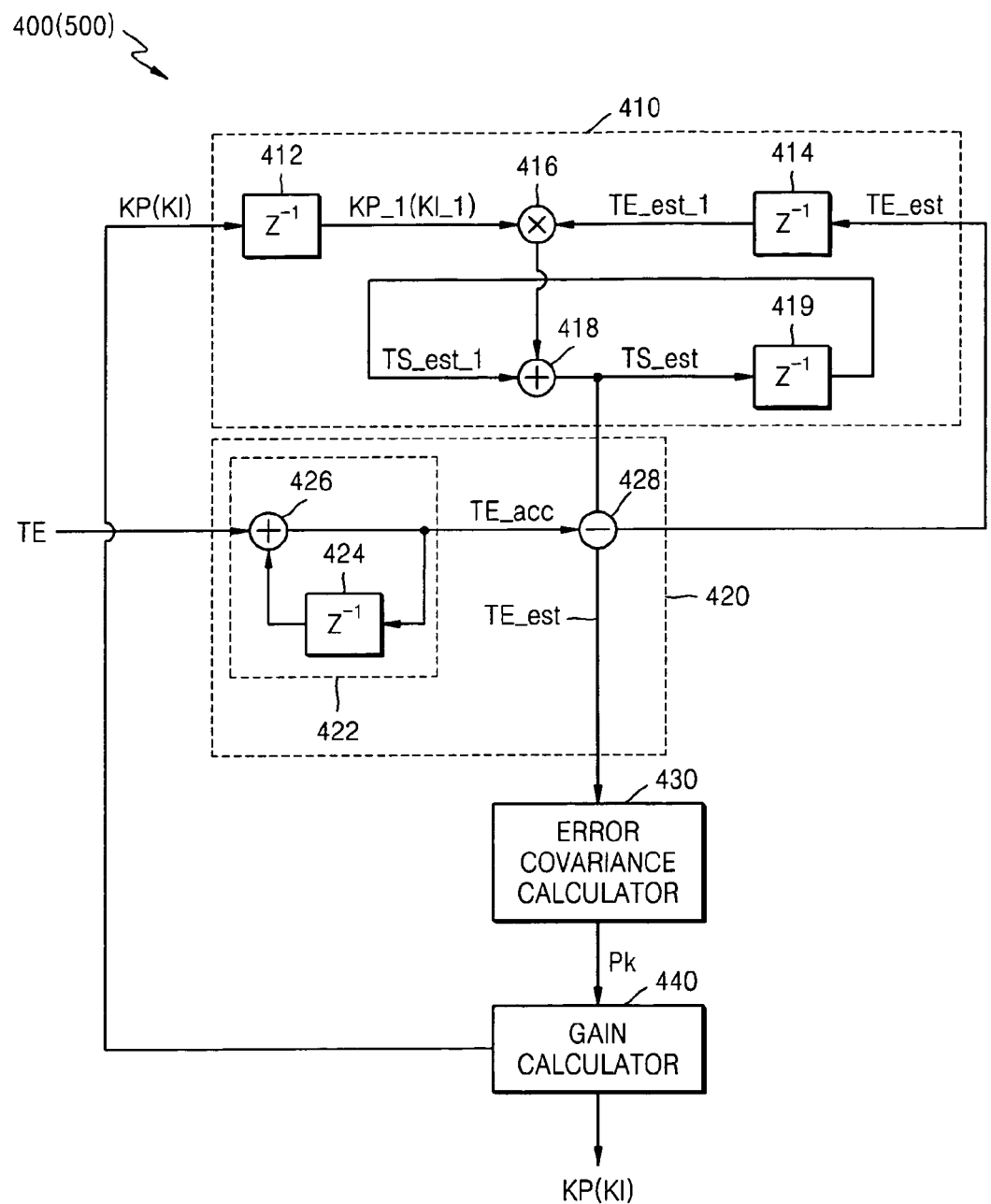
FIG. 4 is a block diagram of the apparatus for updating the gain in the loop filter of FIG. 3, according to an embodiment of the present invention.

FIG. 4 is a block diagram of one of the gain updators 400 and 500 (i.e., an apparatus for updating a gain KP or KI) of the loop filter 300 without monitoring external noise and with simple hard-ware components, according to an embodiment of the present invention. As an example, the proportional gain updator 400 is described with reference to FIG. 4. However, the integral gain updator 500 may also be implemented similarly as illustrated in FIG. 4.

Referring to FIG. 4, the proportional gain updator 400 includes a timing signal estimator 410, a timing error estimator 420, an error covariance calculator 430, and a gain calculator 440. The terms "current" and "prior" are used herein to refer to relationships in time. Thus the term "current value" refers to a value at a given time point, and the term "prior value" refers to a value at another time point that is before such a given time point.

The timing signal estimator 410 generates a current timing signal estimation value Ts_est from a prior timing error estimation value TE_est_1, a prior gain value KP_1, and a prior timing signal estimation value TS_est_1. The timing error estimator 420 generates a current timing error estimation value TE_est by adding prior values of the timing error signal and from the current timing signal estimation value Ts_est.

The error covariance calculator 430 generates an error covariance value Pk from the current timing error estimation value TE_est. The gain calculator 440 generates the current proportional gain value KP from the error covariance value Pk.

Returning to FIG. 4, the timing signal estimator 410 includes a first delay 412, a second delay 414, a first multiplier 416, a first summer 418, and a third delay 419. The first delay 412 generates the prior gain value KP_1 from the gain values KP as generated by the gain calculator 440. The second delay 414 generates the prior timing error estimation value TE_est_1 from the timing error estimation values TE_est generated by the timing error estimator 420.

The first multiplier 416 multiplies the prior timing error estimation value TE_est_1 by the prior gain value KP_1. The third delay 419 generates the prior timing signal estimation value TS_est_1 from the timing signal estimation values TS_est generated by the first summer 418. The first summer 418 adds the output of the first multiplier 416 and the prior timing signal estimation value TS_est_1 to generate the current timing signal estimation value TS_est that is represented as follows:

TS_est=KP_1*TE_est_1+TS_est_1  [Equation 1]

Returning to FIG. 4, the timing error estimator 420 includes a timing error accumulator 422 and a subtractor 428. The timing error accumulator 422 includes a delay 424 and a summer 426 for accumulating all prior values of the timing error signal to generate a timing error accumulation value TE_acc. The subtractor 428 subtracts the current timing signal estimation value TS_est from the timing error accumulation value TE_acc to generate the current timing error estimation value TE_est that is represented as follows.

TE_est=TE_acc_TS_est  [Equation 2]

Returning to FIG. 4, the error covariance calculator 430 generates the error covariance value Pk from the current timing error estimation value TE_est. In one embodiment of the present invention, the error covariance calculator 430 calculates the error covariance value Pk as a minimum of a square of the current timing error estimation value TE_est and an absolute value of the current timing error estimation value TE_est. Thus, such an error covariance value Pk is represented by a minimum of the following expressions:

$Pk=\min(TE\_est^2)$ $Pk=\min(|TE\_est|)$  [Equation 3]

Returning to FIG. 4, the gain calculator 440 generates the current proportional gain KP from the error covariance value Pk. In one embodiment of the present invention, the gain calculator 440 generates the current proportional gain value KP as having the same value as the error covariance value Pk.

The operation of the gain calculator 440 is now explained in more detail. The relationship between the current proportional gain value KP and the error covariance value Pk in a Kalman filter is represented as follows:

$$KP = \frac{Pk}{Pk+R}$$  [Equation 4]

Here, R represents external noise such that the proportional gain value KP is approximately equal to 1 when the error covariance value Pk is substantially larger than the external noise R.

In this manner, the proportional gain updator 400 of FIG. 4 determines the proportional gain KP of the loop filter 300 using just a multiplier, summers, subtractors, and delays. Such components are relatively easy to implement in hardware in contrast to a divider. In one embodiment of the present invention, each of the components 412, 416, 414, 418, 419, 426, 424, and 428 that is one of a multiplier, a summer, a subtractor, or delay is implemented in hard-ware circuitry. In addition, the error covariance calculator 430 and the gain calculator 440 are also implemented as hard-ware circuitry.

Figure 6:
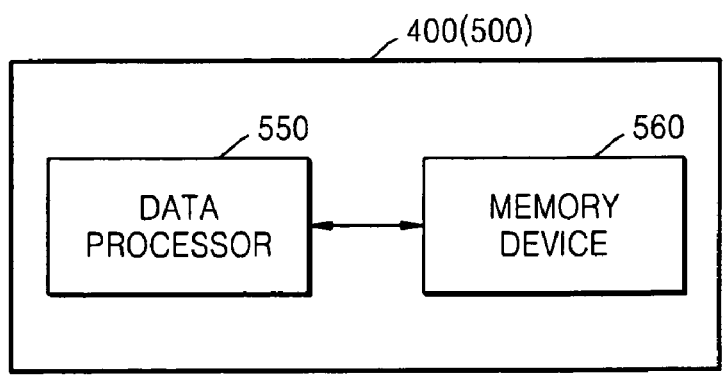
FIG. 6 is a block diagram of an example implementation of the loop filter of FIG. 3, according to another embodiment of the present invention.

The gain updating apparatus 400(500) of FIG. 4 may also be implemented as software as illustrated in FIG. 6, according to an alternative embodiment of the present invention. In that case, the components 412, 416, 414, 418, 419, 426, 424, 428, 430, and 440 of FIG. 4 may be implemented as software modules stored within a memory device 560 in FIG. 6. Such software modules form sequences of instructions (i.e. software) stored in the memory device 560. Execution of such sequences of instructions by the data processor 550 in FIG. 6 causes the data processor 550 to perform the operations/functions as already described herein for each of the components 412, 416, 414, 418, 419, 426, 424, 428, 430, and 440 of FIG. 4.

The foregoing is by way of example only and is not intended to be limiting. For example, any numbers or number of elements described and illustrated herein is by way of example only. The present invention is limited only as defined in the following claims and equivalents thereof.

What is claimed is:

1. An apparatus for updating a gain of a loop filter from a timing error signal, the apparatus comprising:
   a timing signal estimator for generating a current timing signal estimation value from a prior timing error estimation value, a prior gain value, and a prior timing signal estimation value; and
   a timing error estimator for generating a current timing error estimation value from a timing error accumulation value and the current timing signal estimation value,
   wherein a current gain value of the loop filter is determined from the current timing error estimation value.

2. The apparatus of claim 1, the apparatus further comprising:
   an error covariance calculator for generating an error covariance value from the current timing error estimation value; and
   a gain calculator that determines the current gain value from the error covariance value.

3. The apparatus of claim 2, wherein the error covariance calculator generates the error covariance value from a minimum of a square of the current timing error estimation value and an absolute value of the current timing error estimation value.

4. The apparatus of claim 2, wherein the gain calculator generates the current gain value as the error covariance value.

5. The apparatus of claim 1, wherein the timing signal estimator includes:
   a multiplier for multiplying the prior timing error estimation value by the prior gain value to generate a multiplier output; and
   a summer for adding the multiplier output and the prior timing signal estimation value to generate the current timing signal estimation value.

6. The apparatus of claim 1, wherein the timing error estimator includes:
   a timing error accumulator for accumulating prior values of the timing error signal to generate the timing error accumulation value; and
   a subtractor for subtracting the current timing signal estimation value from the timing error accumulation value to generate the current timing error estimation value.

7. The apparatus of claim 1, wherein the current gain value is for one of a proportional gain and an integral gain in the loop filter.

8. The apparatus of claim 1, wherein the loop filter is coupled in a feed-back loop for generating a loop filter output from the current gain value and the timing error signal such that the loop filter output determines adjustment of a timing signal in the feed-back loop.

9. A timing recovery apparatus comprising:
   a timing error detector for detecting a timing error signal from a timing signal; and
   a loop filter for generating a loop filter output from the timing error signal and an adjustable gain, the loop filter including:

a timing signal estimator for generating a current timing signal estimation value from a prior timing error estimation value, a prior gain value, and a prior timing signal estimation value; and a timing error estimator for generating a current timing error estimation value from a timing error accumulation value and the current timing signal estimation value, wherein a current gain value of the loop filter is determined from the current timing error estimation value.

10. The timing recovery apparatus of claim 9, further comprising:

a timing error compensator and a controlled oscillator for adjusting the timing signal from the loop filter output in a feed-back path.

11. The timing recovery apparatus of claim 9, wherein the loop filter further includes:

an error covariance calculator for generating an error covariance value from the current timing error estimation value; and a gain calculator that determines the current gain value from the error covariance.

12. The timing recovery apparatus of claim 9, wherein the loop filter further includes:

a multiplier for multiplying the prior timing error estimation value by the prior gain value to generate a multiplier output; and a summer for adding the multiplier output and the prior timing signal estimation value to generate the current timing signal estimation value;

and wherein the timing error estimator includes:

a timing error accumulator for accumulating prior values of the timing error signal to generate the timing error accumulation value; and a subtractor for subtracting the current timing signal estimation value from the timing error accumulation value to generate the current timing error estimation value.

13. The timing recovery apparatus of claim 9, wherein the current gain value is for one of a proportional gain and an integral gain in the loop filter.

14. An apparatus for updating a gain of a loop filter from a timing error signal, the apparatus comprising:

a data processor; and a memory device having sequences of instructions stored thereon, wherein execution of the sequences of instructions by the data processor causes the data processor to perform the steps of:

generating a current timing signal estimation value from a prior timing error estimation value, a prior gain value, and a prior timing signal estimation value;

generating a current timing error estimation value from a timing error accumulation value and the current timing signal estimation value; and determining a current gain value of the loop filter from the current timing error estimation value.

15. The apparatus of claim 14, wherein execution of the sequences of instructions by the data processor causes the data processor to further perform the steps of:

generating an error covariance value from the current timing error estimation value; and determining the current gain value from the error covariance.

16. The apparatus of claim 15, wherein execution of the sequences of instructions by the data processor causes the data processor to further perform the step of:

generating the error covariance value from a minimum of a square of the current timing error estimation value and an absolute value of the current timing error estimation value.

17. The apparatus of claim 16, wherein execution of the sequences of instructions by the data processor causes the data processor to further perform the step of:

generating the current gain value as the error covariance.

18. The apparatus of claim 14, wherein execution of the sequences of instructions by the data processor causes the data processor to further perform the steps of:

multiplying the prior timing error estimation value by the prior gain value to generate a multiplier output;

adding the multiplier output and the prior timing signal estimation value to generate the current timing signal estimation value;

accumulating prior timing error measurement values to generate the timing error accumulation value; and subtracting the current timing signal estimation value from the timing error accumulation value to generate the current timing error estimation value.

19. The apparatus of claim 14, wherein the current gain value is for one of a proportional gain and an integral gain in the loop filter.

20. The apparatus of claim 14, wherein the loop filter is coupled in a feed-back loop for generating a loop filter output from the current gain value and the timing error signal such that the loop filter output adjusts a timing signal in the feed-back loop.

* * * * *